(12) United States Patent
Hollis

(10) Patent No.: US 10,347,304 B2
(45) Date of Patent: *Jul. 9, 2019

(54) APPARATUSES AND METHODS FOR PARALLEL I/O OPERATIONS IN A MEMORY

(71) Applicant: MICRON TECHNOLOGY, INC., Boise, ID (US)

(72) Inventor: Timothy M. Hollis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/045,468

(22) Filed: Jul. 25, 2018

(65) Prior Publication Data

US 2019/0108864 A1    Apr. 11, 2019

Related U.S. Application Data

(63) Continuation of application No. 15/729,393, filed on Oct. 10, 2017, now Pat. No. 10,043,557.

(51) Int. Cl.
*G11C 7/10* (2006.01)
*G11C 8/10* (2006.01)

(52) U.S. Cl.
CPC .............. *G11C 7/1006* (2013.01); *G11C 8/10* (2013.01)

(58) Field of Classification Search
None
See application file for complete search history.

(56) References Cited

U.S. PATENT DOCUMENTS

| 10,043,557 | B1 * | 8/2018 | Hollis ............... G11C 8/10 |
| 2002/0126531 | A1 | 9/2002 | Hosono et al. |
| 2002/0191479 | A1 | 12/2002 | Yamauchi et al. |
| 2009/0316485 | A1 | 12/2009 | Heo et al. |
| 2014/0016404 | A1 | 1/2014 | Kim et al. |
| 2014/0093076 | A1 | 4/2014 | Liikanen et al. |
| 2016/0211028 | A1 | 7/2016 | Berman et al. |
| 2017/0212695 | A1 | 7/2017 | Hollis et al. |
| 2017/0220472 | A1 | 8/2017 | You et al. |

OTHER PUBLICATIONS

International Search Report and Written Opinion dated Jan. 28, 2019 for PCT Application No. PCT/US2018/054673, 10 pages.

* cited by examiner

*Primary Examiner* — Tuan T Nguyen
(74) *Attorney, Agent, or Firm* — Dorsey & Whitney LLP

(57) ABSTRACT

Apparatuses and methods for a multi-level communication architectures are disclosed herein. An example apparatus may include an input/output (I/O) circuit comprising a driver circuit configured to convert a first bitstream directed to a first memory device and a second bitstream directed to a second memory device into a single multilevel signal. The driver circuit is further configured to drive the multilevel signal onto a signal line coupled to the first memory device and to the second memory device using a driver configured to drive more than two voltages.

23 Claims, 11 Drawing Sheets

APPARATUSES AND METHODS FOR PARALLEL I/O OPERATIONS IN A MEMORY

CROSS-REFERENCE TO RELATED APPLICATION

This application is a continuation of U.S. patent application Ser. No. 15/729,393, filed Oct. 10, 2017. This application is incorporated by reference herein in its entirety and for all purposes.

BACKGROUND

The pursuit of making computing systems more powerful, more power efficient, and more compact has led to advancement in interface communications to improve throughput. In some examples, memory device architectures have become more complex, and sometimes three dimensional. While the increased complexity has resulted in higher capacity memory devices, throughput limitations around input/output (I/O) operations may restrict an ability to continue to increase data throughput of a computing system.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
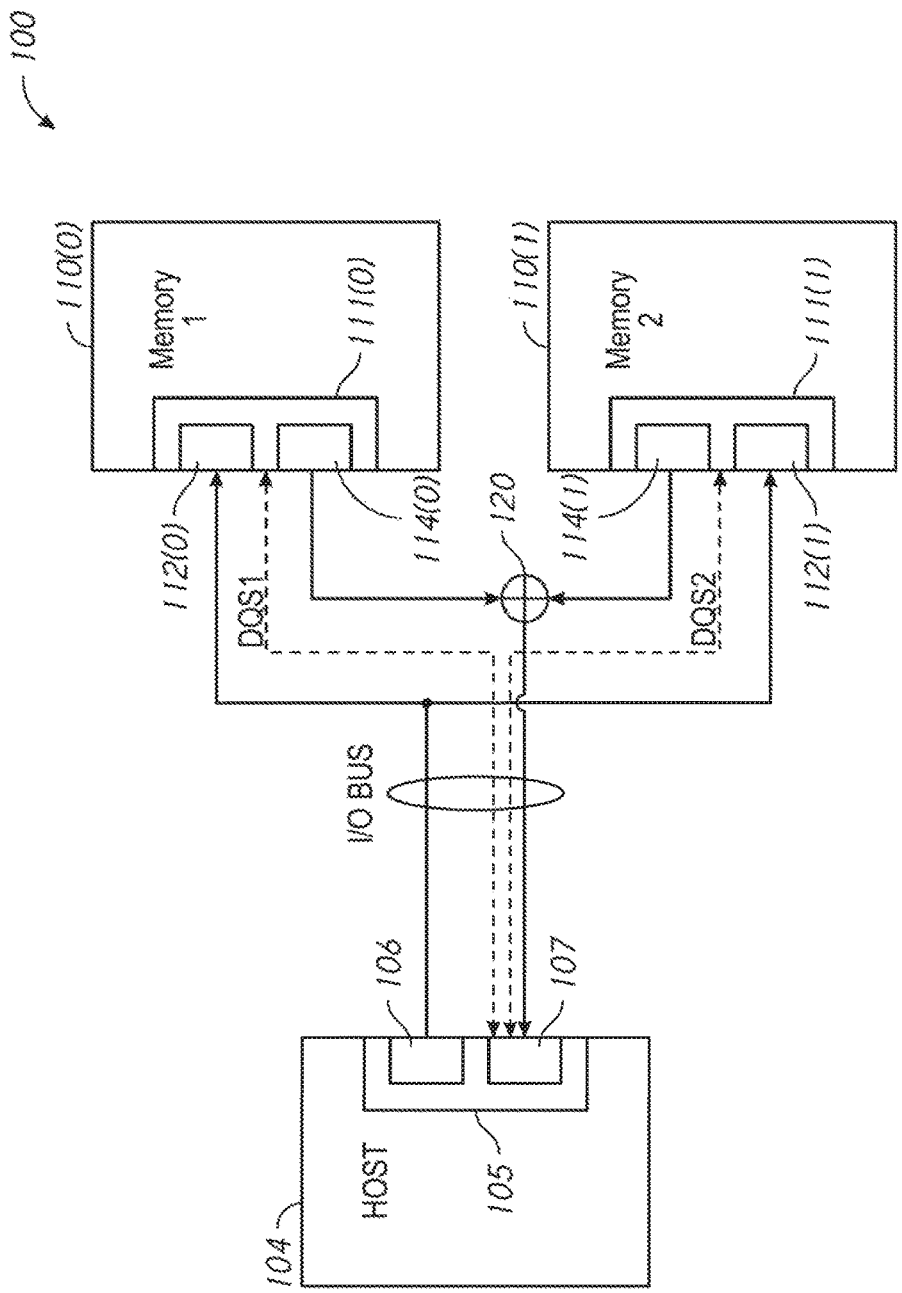
FIG. 1 is a block diagram of an apparatus according to an embodiment of the present disclosure.

FIG. 1 is a block diagram of a memory system 100 according to an embodiment of the present disclosure. The system 100 may include a host 104 that communicates with memory devices 110(0)-(1) over an input/output (I/O) bus. The host 104 may include any circuit configured to interface with a memory, including a memory controller, a logic chip in a stacked memory device, etc. The host 104 may include an I/O interface circuit 105 that includes driver circuit 106 and receiver and decoder circuit 107 for communication over the I/O bus. The memory devices 110(0)-(1) may each include a respective I/O interface circuit 111(0)-(1). Each of the I/O interface circuits 111(0)-(1) includes a respective driver circuit 114(0)-(1) and a respective receiver and decoder circuit 112(0)-(1) for communication over the I/O bus. The memory devices 110(0)-(1) may include an interconnect 120 that merges signals sent over the I/O bus to the host 104. The I/O bus may support a multi-level communication architecture that includes a plurality of channels. In some embodiments, each channel may be single-ended and may include a single signal line. In other embodiments, each channel may include more than one signal line. In one embodiment, the host 104, the memory devices 110(0)-(1), and the I/O bus may support a channel that includes multilevel signaling to contemporaneously communicate independent bitstreams to each of the memory devices 110(0)-(1). For example, the host 104 may provide a multilevel signal that uses a most-significant bit (MSB) portion to communicate a first bitstream to the memory device 110(0) and a least-significant bit (LSB) portion to communicate a second bitstream to the memory device 110(1). The host 104 via the driver circuit 106 may use pulse-amplitude modulation (PAM) to convert the 2 bitstreams into a single multilevel signal for transmission over the I/O bus.

A bitstream includes a plurality of bits provided serially, where each bit of the bitstream is provided over a period of time, which may be referred to as a data period. For example, a first bit is provided for a first period, a second bit is provided for a second period following the first period, a third bit is provided for a third period following the second period, and so on. The successive bits provided in this serial manner represent a stream of bits. The corresponding bits of each bitstream for a data period represents data K bits wide. A multilevel signal may have one of three or more voltage levels (in contrast to binary signals which may have one of two voltage levels to represent a data value), where the voltage level of the multilevel signal represents a data value. The K multilevel signals may be transmitted over the I/O bus. Each multilevel signal is provided over a data period having a voltage corresponding to one of multiple voltage levels (e.g., 2 different voltage levels, 4 different voltage levels, 8 different voltage levels, etc.), where each of the multiple voltage levels represents different data. In one example, 2 bit streams may be converted to one 4-level signal. In another example, pulse-amplitude modulation (PAM) may be used to convert 2, 3, or 4 bitstreams into a single multilevel signal having 4, 8, 16, etc., levels.

For example, in a conventional memory device having 8 input/output (I/O) terminals, total of 64 bits of data can be accessed (e.g., read or written) in a column operation. That is, each of 8 I/O terminals may be provided with 8 serialized data, resulting in a total of 64 bits of data (e.g., 8 I/O terminals multiplied by 8 bits (in serial) per I/O terminal). In the conventional memory device, a set of 8 data is converted in series using a first-in, first-out (FIFO) circuit because there are 8 bits of I/O terminals (not 64). In an embodiment of the disclosure, for example, where 2 bits are converted to a multilevel signal (e.g., having one of four different voltage levels to represent the 2 bit value), the 8 serialized data can be converted into 4 serialized data, or 8 I/O terminals can be reduced to 4 bits of I/O terminals (where each of the 4 I/O terminals is provided with 8 serialized data).

In the other direction, the memory devices 110(0)-(1) may each include bits of circuitry to transmit respective bitstreams to the interconnect 120, where they are combined into a single multilevel signal to be transmitted to the host 104. Each of the memory devices 110(0)-(1) may have a respective drive strength such that the provided signals, when combined at the interconnect 120, results in a decodable multilevel signal. In some examples, the multilevel signaling may be unidirectional, such as the multilevel signaling may be implemented from the host 104 to the memory devices 110(0)-(1), but the memory devices 110(0)-(1) communicate using with bi-level signaling back to the host 104, or vice versa. In some examples, the multilevel signaling may be implemented for command and address signals and/or control signals.

In some examples, the host 104 may include a memory controller or processing system and/or the memory devices 110(0)-(1) may include a memory, including volatile memory and/or non-volatile memory. In some examples, the memory devices 110(0)-(1) may include a dynamic random access memory (DRAM), such as a double-data-rate (DDR) DRAM or a low power DDR DRAM. In some examples, the memory devices 110(0)-(1) may be stacked memory devices.

The driver circuit 106 may include circuitry that converts the two independent bitstreams to be transmitted to the memory devices 110(0)-(1) into a single multilevel signal. The driver circuits 114(0)-(1) of the memory devices 110(0)-(1) may each include circuitry to transmit respective bitstreams to the interconnect 120, where they are combined into a single multilevel signal to be transmitted to the host 104. The drive strengths of each of the driver circuits 114(0)-(1) may be set to respective different drive strengths such that when the signals are combined at the interconnect 120, a decodable multilevel signal is provided.

The receiver and decoder circuit 107 may include decoders configured to recover each of the bitstreams by decoding the multilevel signal received via the I/O bus as provided by one or more of the driver circuits 114(0)-(1). Further, each of the receiver and decoder circuits 112(0)-(1) may include comparator and decoder logic circuits configured to recover a respective bitstream from the multilevel signal received via the I/O bus as provided by the driver circuit 106.

In operation, the host 104 and the memory devices 110(0)-(1) may communicate over the I/O bus to transfer information, such as data, addresses, commands, etc. While the I/O bus is shown to include separate unidirectional signal lines for transmit and receive, it is within the scope of the invention that the I/O bus be implemented as bidirectional. The I/O interface circuit 105 and memory devices 110(0)-(1) may implement multilevel communication architecture. In a multi-level communication architecture, a signal having multiple (e.g., more than two) contemporaneous values may be sent on a signal line of a channel. A receiver may retrieve a bitstream from the multilevel signal. In a single-ended architecture (e.g., voltage sent over line compared with a reference voltage, as compared with differential architecture where differential voltage between two lines is used to communicate), the voltage levels of the multilevel signal may be compared against one or more reference values to determine the bitstream value. A receiver has a time period to determine and latch the output signal value from the time the output signal transitions to the current value to the time the output signal transitions to the next value.

In an example, the driver circuit 106 may provide two different independent bitstreams; a first bitstream signal directed to the memory device 110(0) and a second bitstream directed to the memory device 110(1). The driver circuit 106 may further combine the two bitstreams into a single multilevel signal, with the MSB values corresponding to the first bitstream and the LSB values corresponding to the second bitstream, in an example. The multilevel signal may be transmitted to the receiver and decoder circuits 112(0)-(1) via signal lines of the I/O bus. Each of the receiver and decoder circuits 112(0)-(1) may detect voltage levels of the multilevel signal provided on the signal lines to decode first and second bitstreams, respectively. By using multilevel signals, as compared with binary signals, data for each of the memory devices 110(0)-(1) may be transmitted contemporaneously over a shared bus.

In the other direction, the driver circuits 114(0)-(1) of the memory devices 110(0)-(1) may transmit respective first and second bitstreams to the interconnect 120, where they are combined into a single multilevel signal. The signal driven by the driver circuit 114(0) may be stronger (e.g., have a higher current or voltage) than the signal driven by the driver circuit 114(1) such that in the combined multilevel signal, the MSB values correspond to the first bitstream from the driver circuit 114(0) and the LSB values correspond to the second bitstream from the driver circuit 114(1), in an example. The multilevel signal may be transmitted to the receiver and decoder circuit 107 via signal lines of the I/O bus. The receiver and decoder circuit 107 may detect voltage levels of the multilevel signal provided on the signal lines to decode first and second bitstreams, respectively. In some examples, the memory device 110(0) may provide a strobe signal to the host 104 and/or the memory device 110(1) to detect and/or control symbol period transitions. For example, to synchronize transitions, the memory device 110(1) may provide the second bitstream timed according to the strobe signal received from the memory device 110(0) such that bit/symbol transitions on the first bitstream coincide with bit/symbol transitions on the second bitstream.

Communication protocol between the driver circuit 114(0)-(1) and the receiver and decoder circuit 107 may be similar to the communication protocol between the encoder and driver circuit 106 and the receiver and decoder circuits 112(0)-(1). In some examples, the driver circuit 114(0)-(1) may eliminate an encoder and provide the first and second bitstreams directly to a driver. The driver circuit 106 may include a DRAM driver that has been segmented (e.g., assigning a respective different number of legs of the driver to each signal to be driven) to drive multiple (e.g., more than 2) voltage levels on a signal line.

In some examples, timing between the first and second memory devices 110(0)-(1) may be important in driving signals over the I/O bus. Thus, one or both of the memory devices 110(0)-(1) may provide a respective strobe signal DQS1 or DQS2 to the host 104 to provide a clock signal used to capture data received at the host. The DQS signal may also be provided to one or both of the memory devices 110(0)-(1), and the respective I/O circuits 111(0)-(1) may include a timing circuit to synchronize transition timing between symbols for receipt of transmission the respective DQS1 or DQS2 signal.

FIG. 1 shows two memory devices 110(0)-(1). It will be appreciated that more than two memories may be included, with the number of levels in the multilevel signaling increasing accordingly (e.g., 8 levels for a three memory device system, 16 levels for a 4 memory device system, etc.), without departing from the scope of the disclosure. In some examples, control signals (e.g., chip select signals, or some other control signal) may be provided by the host 104 over the I/O bus to the memory devices 110(0)-(1) to assign a bit level (e.g., MSB or LSB in the two memory device example) of the multilevel signal. In some examples, the memory devices 110(0)-(1) may include identical architecture, and may be configured to receive or transmit MSB or LSB data on the multilevel signal lines based on a signal received from the host 104, or based on a configuration setting stored at the respective memory devices 110(0)-(1). As a number of memory devices increases, a number of levels on the multilevel signals may also increase to accommodate the increase in memory devices. While the disclosure discusses the memory devices as being stacked, it will also be appreciated that they memory devices may also be non-stacked devices. Further, the memory device may be stacked in a vertical arrangement, arranged in a planar relationship, either within the same package or across multiple packages, or may be mounted directly onto an interposer without packaging, such as in a high bandwidth memory application. Further, while the multilevel signaling for the memory system 100 is described in terms of a voltage-based application where signals are transmitted at different voltage levels to indicate different values, the memory system 100 may alternatively implement a current-based application where different current magnitudes indicate different values. That is, in a current-based application, different current magnitudes may be used to indicate a respective value on a multilevel signal, and the host 104 and memory devices 110(0)-(1) may send signals using the different current magnitudes to communicate the bitstreams. In some examples, the current-based application may be implemented in systems where the memory devices 110(0)-(1) are stacked.

Figure 2A:
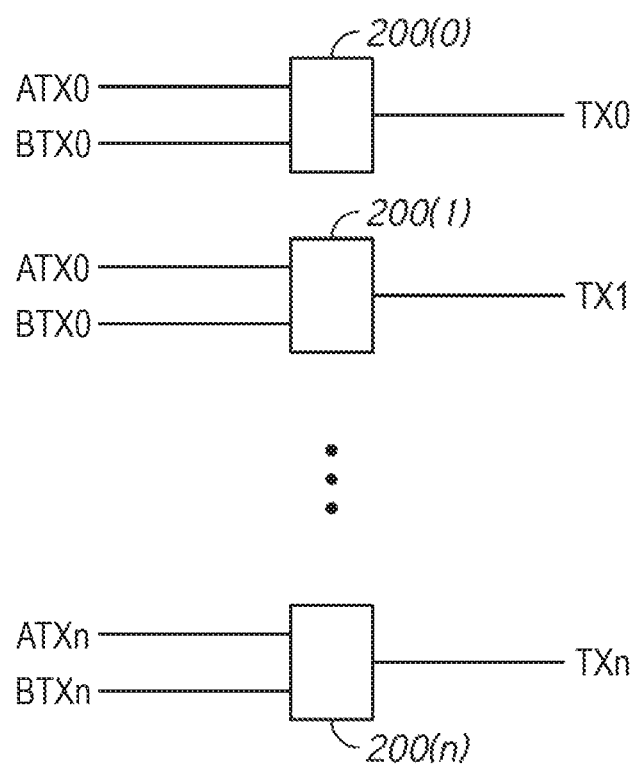
FIGS. 2A and 2B are block diagrams of a driver circuit for a multilevel communication architecture according to an embodiment of the present disclosure.
Figure 2B:
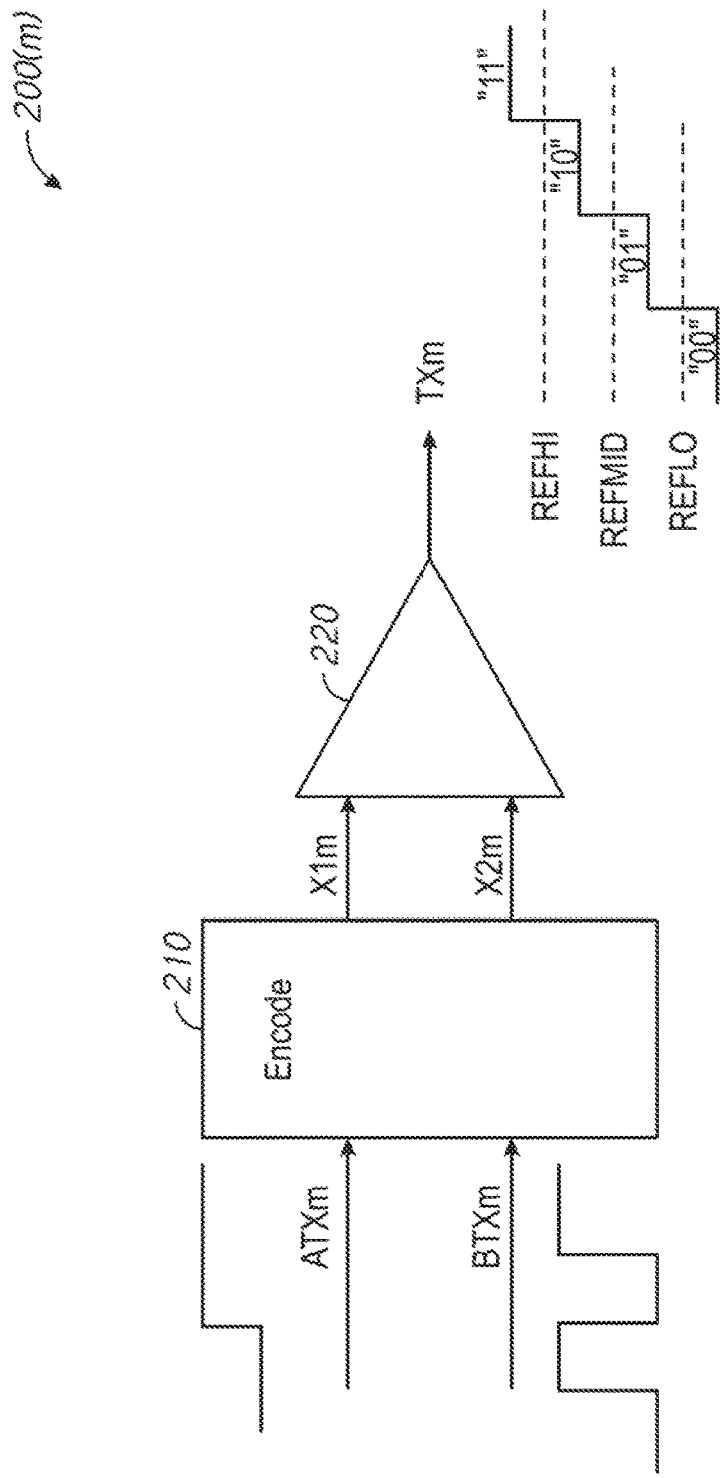

FIGS. 2A and 2B are block diagrams of driver circuits for a multilevel communication architecture according to an embodiment of the present disclosure. FIG. 2A shows multiple driver circuits 200(0)-(n) each configured to encode and combine respective bitstreams ATX1-n and BTX1-n onto respective signal lines TX1-n. FIG. 2B is a detailed depiction of a single driver circuit 200(m) corresponding to individual ones of the driver circuits 200(0)-(n). The driver circuit 200(m) may encode a first bitstream ATXm and a second bitstream BTXm into control signals X1m and X2m, respectively, and may combine the ATXm and BTXm bitstreams into a single multilevel signal TXm. The driver circuits 200(0)-(n) of FIG. 2A and/or the driver circuit 200(m) of FIG. 2B may be implemented in the driver circuit 106 of FIG. 1. For clarity, the foregoing description will pertain to the driver circuit 200(m) of FIG. 2B, but it is understood that similar components and operation may be implemented in the individual driver circuits 200(0)-(n) of FIG. 2A.

The driver circuit 200(m) may include an encoder 210 coupled to a driver circuit 220. The encoder 210 may be configured to receive bitstreams ATXm and BTXm. The encoder 210 may encode the ATXm and BTXm bitstreams to provide X1m and X2m control signals. The driver circuit 220 may receive the X1m and X2m control signals and may drive a voltage on the TXm signal over a signal line of an I/O bus based on the X1m and X2m control signals.

In operation, the ATXm and BTXm bitstreams are transmitted over the I/O bus as a multilevel signal to both memory devices. Rather than send each bitstream on separate signal lines over separate I/O buses, or send the bitstreams sequentially, the driver circuit 200(m) may encode the ATXm and BTXm bitstreams for transmission over a single signal line using multilevel signals. For example, the encoder 210 may receive the ATXm and BTXm bitstreams, and may encode symbol data of the two bitstreams in the form of the X1m and X2m control signals to control the driver circuit 220 to drive the signal line of the I/O bus to a respective voltage. While the embodiment illustrated in FIG. 2 is provided with two bitstreams ATXm and BTXm, which are encoded and combined into the TXm multilevel signal, in other embodiments, more than two bitstream signals may be encoded and combined into a multilevel signal.

The encoder 210 may include control logic to provide each of the X1m and X2m control signals. The driver circuit 220 may drive a voltage of the TXm signal on the signal line of the I/O bus responsive to the X1m and X2m control signals. In an example, the voltages driven by the driver circuit 220 may be one of four levels. For example, the four levels may be (1) less than a low reference signal REFLO, corresponding to data "00"; (2) between the REFLO signal and a middle reference signal REFMID, corresponding to data "01"; (3) between the REFMID signal and a high reference signal REFHI, corresponding to data "10"; and (4) greater than the REFHI signal, corresponding to data "11". The driver circuit 220 may drive the TXm signal such that the ATXm bitstream is encoded as the most significant bits (MSB) of the TXm signal (e.g., either greater than or less than the REFMID signal) and the BTXm bitstream is encoded as the least significant bits (LSB) of the TXm signal (e.g., decoded using all three reference voltages REFLO, REFMID, and REFHI). For example, when the level of the TXm signal is greater than REFHI, the ATXm bitstream is high and the BTXm bitstream is high; when the level of the TXm signal is between REFMID and REFHI, the ATXm bitstream is high and the BTXm bitstream is low; when the level of the TXm signal is between REFLO and REFMID, the ATXm bitstream is low and the BTXm bitstream is high; and when the level of the TXm signal is less than REFLO, the ATXm bitstream is low and the BTXm bitstream is low.

Moreover, as an example, it is be assumed that the ATXm bitstream has a bitstream "0", "0", "1" and "1" and the BTXm has a bitstream "0", "1", "0" and "1", while the ATXm and the BTXm are streamed over the same or overlapping time intervals or simultaneously. The encode 201 receives the ATXm and the BTXm bitstreams and the driver circuit 220 produces the TXm multilevel signals as indicated in the FIG. 2B. It is noted that the ATXm bitstream and the BTXm bitstream need not be completely simultaneous, but are acceptable for this disclosure while at least overlapping a portion of the ATXm bitstream and the BTXm bitstream. If there is no overlap between the ATXm and BTXm bitstreams, then the primary advantage of higher interface throughput will not be realized.

Figure 3:
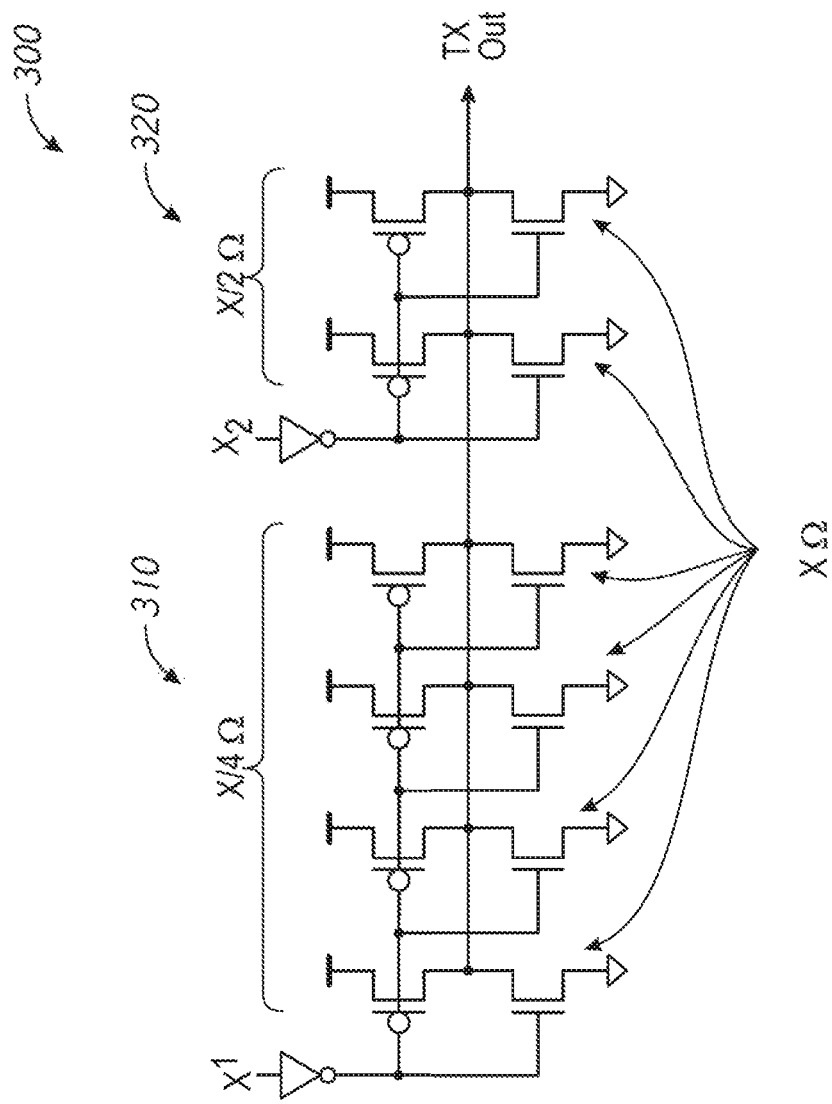
FIG. 3 is a schematic drawing of a driver circuit for a multilevel signal architecture according to an embodiment of the disclosure.

FIG. 3 is a schematic drawing of a driver circuit 300 for a multilevel signal architecture according to an embodiment of the disclosure. While the driver circuit 300 is depicted with six legs, more or less legs may be included without departing from the scope of the disclosure. In the embodiment of FIG. 3, the driver circuit 300 may include six signal line drivers (e.g., "legs"). In some embodiments, each of the signal line drivers has an impedance of X ohms. In some examples, X is 240 ohms. Moreover, the driver circuit 300 may include a first driver section 310 and a second driver section 320 configured to drive an output signal TX OUT to a signal line based on control signals that are complements of the X1 and X2 signals. The TX OUT signal may be a multilevel signal representing data of two bitstreams (e.g., the ATX and BTX bitstreams) driven over an I/O bus. The driver circuit 300 may be implemented in the driver circuit 106 of FIG. 1 or the driver circuit 220 of FIG. 2.

The first driver section 310 may include four legs, each controlled responsive to the complement X1 control signal. Each leg may include a pull up (e.g., p-type) transistor and a pull down (e.g., n-type) transistor. Similarly, the second driver section 320 may include two legs, each controlled responsive to the complement X2 control signal, and each leg may include a pull up (e.g., p-type) transistor and a pull down (e.g., n-type) transistor. In an embodiment when each leg has an impedance of X ohms, the first driver section 310 has an effective impedance of X/4 ohms and the second driver section 320 has an effective impedance of X/2 ohms. The ratio of the allocated driver sections indicates a number of uniformly spaced levels. For example, a 2:1 effective impedance ratio will generate four uniformly spaced levels. Similarly, a 4:2:1 impedance ration will generate eight uniformly-spaced levels for a 3-bit transmission.

In operation, the driver circuit 300 may drive the TX OUT signal responsive to the complement X1 and X2 control signals. The complement X1 and X2 control signals may be provided to the legs of the driver sections 310 and 320 to provide the TX OUT signal having appropriate voltage for the multilevel signal. The complement X1 and X2 control signals may implement PAM to convert respective bitstreams into a multilevel TX OUT signal. The bitstreams may be provided to appropriate legs of the driver circuit 300 via the complement X1 and X2 control signals. For example, in some embodiments using PAM4 to convert two bitstreams (e.g., the ATX and BTX bitstreams) into the TX OUT signal, the ATX signal may be provided to the legs of the first driver section 310 as the complement X1 control signal and the BTX bitstreams may be provided to the legs of the second driver section 320 as the complement X2 control signal. The resulting output signal will have a voltage representing the data of the ATX and BTX bitstreams. For example, in terms of the X1 and X2 control signals (e.g., logical inverse of the complement X1 and X2 control signals): when X is low and X2 is low (e.g., "00"), the output will be low; when X1 is low and X2 is high (e.g., "01"), the output will be a first medium high signal; when X1 is high and X2 is low (e.g., "10"), the output will be a second medium high signal that is greater than the first medium high signal; and when X1 is high and X2 is high (e.g., "11"), the output will be high that is greater than the second medium high signal. Other PAM implementations may be used if transmitting more than one bitstream over the TX OUT signal.

Figure 4A:
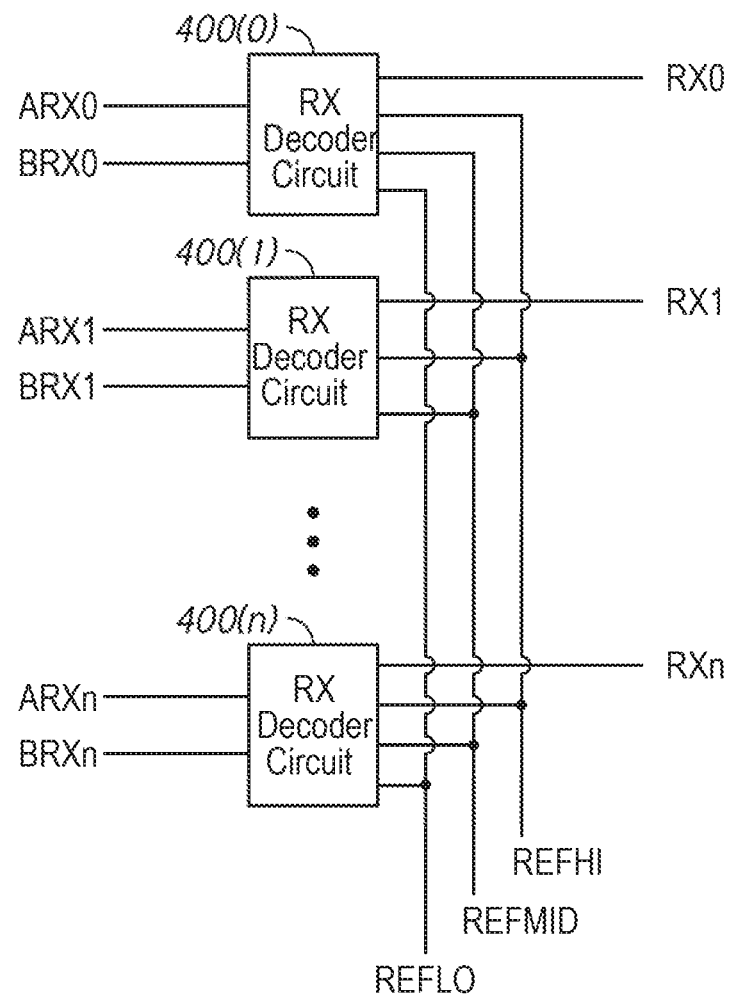
FIGS. 4A and 4B are a block diagram of a receiver and decoder circuit for a multilevel communication architecture according to an embodiment of the present disclosure.
Figure 4B:
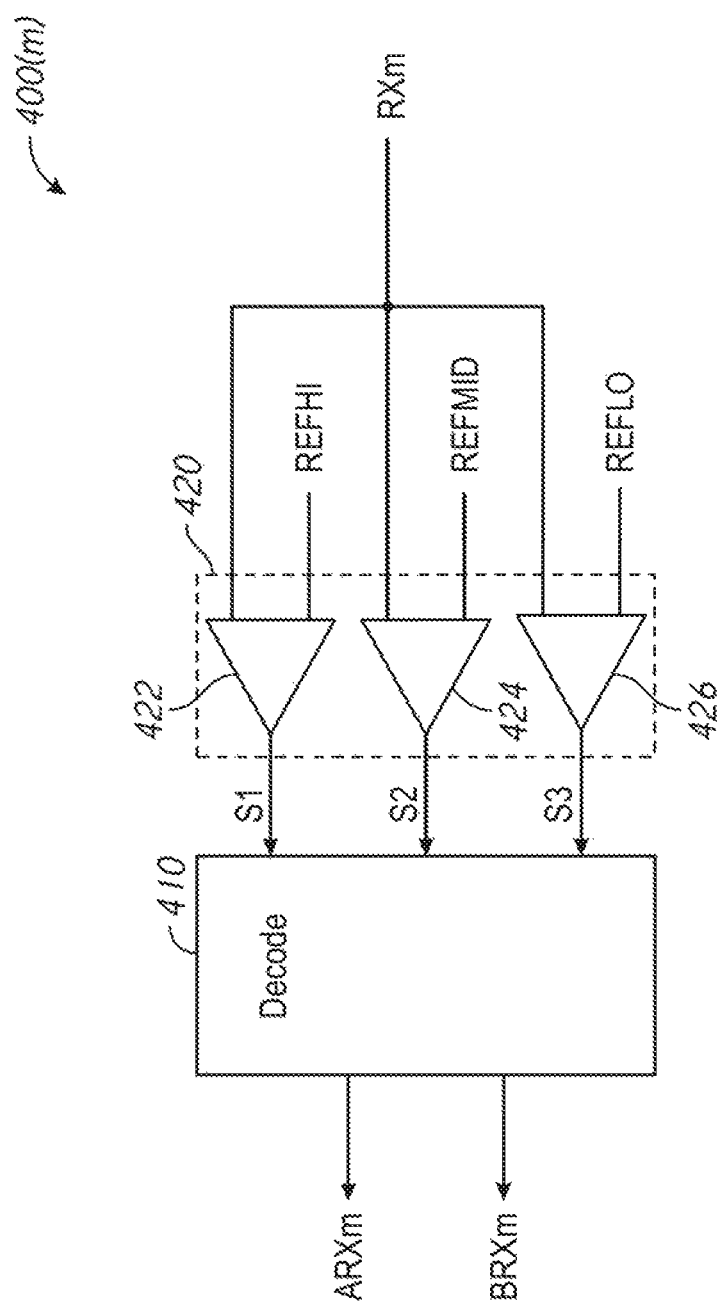

FIGS. 4A and 4B are block diagrams of receiver and decoder circuits for a multilevel communication architecture according to an embodiment of the present disclosure. FIG. 4A shows multiple the receiver and decoder circuits 400(0)-(n) each configured to receive a multilevel signal on a respective signal line RX0-n and decode the respective multilevel signal to determine corresponding bitstreams ARX1-n and BRX1-n. FIG. 4B is a detailed depiction of a receiver and decoder circuit 400(m) corresponding to individual ones of the receiver and decoder circuits 400(0)-(n). The receiver and decoder circuit 400(m) may receive a multilevel signal RXm and decode the multilevel signal RXm to determine a first bitstream ARXm and a second bitstream BRXm. The receiver and decoder circuits 400(0)-(n) of FIG. 4A and/or the driver circuit 400(m) of FIG. 4B may be implemented in the receiver and decoder circuit 107 of FIG. 1. For clarity, the foregoing description will pertain to the receiver and decoder circuit 400(m) of FIG. 4B, but it is understood that similar components and operation may be implemented in the individual receiver and decoder circuits 400(0)-(n) of FIG. 4A.

The receiver and decoder circuit 400(m) may include a comparison circuit 420 coupled to a decoder 410. The comparison circuit 420 may include comparators 422, 424, and 426 coupled to the decoder 410. The comparators 422, 424, and 426 may be configured to receive the received signal RXm of the I/O bus. The comparator 422 may compare the RXm signal to a high reference signal REFHI to provide a first signal S1 to the decoder 410. The comparator 424 may compare the RXm signal to a middle reference signal REFMID to provide a second signal S2 to the decoder 410. The comparator 426 may compare the RXm signal to a low reference signal REFLO to provide a third signal S3 to the decoder 410. The decoder 410 may include logic to generate the ARXm and BRXm bitstreams. The ARX and BRX bitstreams signals may be logical equivalent of bitstreams transmitted from respective memory devices. The S1-S3 signals may be logic signals that are not necessarily driven from rail-to-rail voltages (e.g., VDD to VSS voltages).

In operation, the comparators 422, 424, and 426 may receive the voltage from the RX signal via a signal line of the I/O bus. The comparator 422 may provide the first signal S1 based on the comparison between the voltage of the RXm signal and the REFHI voltage. The comparator 424 may provide the second signal S2 based on the comparison between the voltage of the RXm signal and the REFMID voltage. The comparator 426 may provide the third signal S3 based on the comparison between the voltage of the RXm signal and the REFLO voltage. The decoder 410 may include decoding logic to generate ARXm and BRXm bitstreams based on the first, second, and third signals S1-S3. For example, the ARXm bitstream may be the MSB of the RX signal and the BRXm bitstream may be the LSB of the RXm signal. Thus, the ARXm bitstream is decoded based on the value of the second signal S2 from the comparator 424. The BRXm bitstream is decoded based on the values of each of the first, second and third signals S1-S3 from the comparator 422, 424, and 426, respectively. For example, when the level of the first signal is high, the BRXm bitstream is high; when the level of the first signal S1 is low and the level of the second signal S2 is high, the BRXm bitstream is low; when the level of the second signal S2 is low and the level of the third signal S3 is high, the BRXm bitstream is high; and when the level of the third signal S3 is low, the BRXm bitstream is low. The following truth table illustrates the relationships between the S1-S3 signals and the ARXm and BRXm bitstreams:

| S1 | S2 | S3 | ARXm | BRXm |
|----|----|----|------|------|
| 0  | 0  | 0  | 0    | 0    |
| 0  | 0  | 1  | 0    | 1    |
| 0  | 1  | 1  | 1    | 0    |
| 1  | 1  | 1  | 1    | 1    |

In some examples, data from two different memory devices may start at different times based on known read latencies. For example, a first read request may be provided to a first memory device before a second read request is provided to a second memory device. As a result, transmission of first read data from the first memory device may begin before transmission of second read data from the second memory device. Thus, the decoder 410 may further decode data received via the RXm signal based on these known read latencies.

The ARX and BRX bitstreams may be provided to downstream circuitry for processing, such as being processed as data to be stored at a memory location/address or as data that has been retrieved from a memory, or as commands or addresses to be decoded and used to perform memory access operations. While FIG. 4 depicts a receiver and decoder circuit 400(m) that decodes the RX signal into two separate bitstreams, the receiver and decoder circuit 400(*m*) may be altered to include decoding of additional or less bitstreams by detecting more than four different voltage levels of the RX signal.

Figure 5:
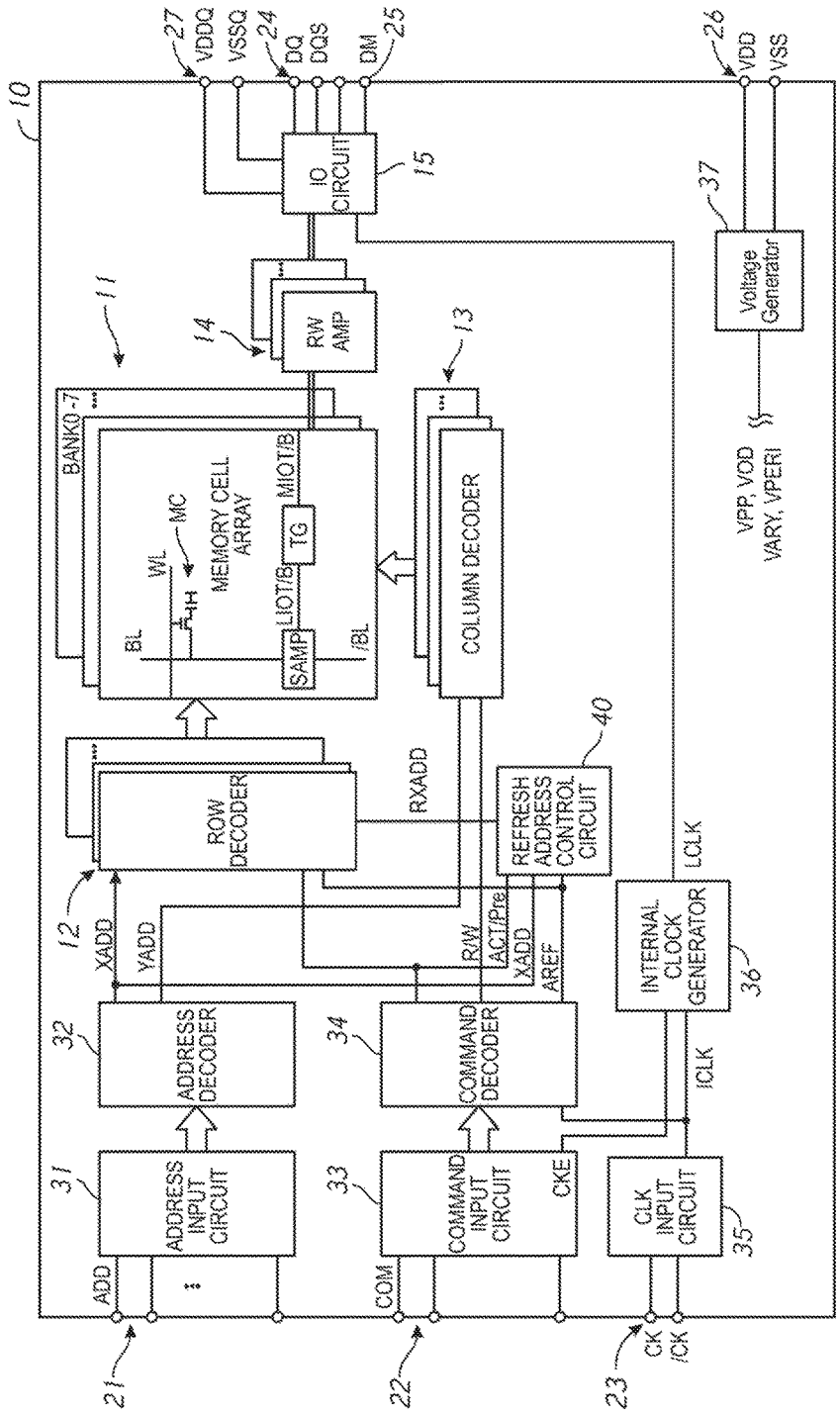
FIG. 5 is a block diagram showing an overall configuration of a semiconductor device according to a first embodiment of the present disclosure.

FIG. 5 is a block diagram showing an overall configuration of a semiconductor device 10 according to a first embodiment of the present disclosure. The semiconductor device may be implemented in one or both of the memory devices 110(0)-(1) of FIG. 1.

The semiconductor device 10 according to the present embodiment is a synchronous DRAM (SDRAM) of, for example, a Double Data Rate 3 (DDR3) Double Data Rate 4 (DDR4) type, Double Data Rate 5 (DDR5), low power DDR4 (LPDDR4), or low power DDR5 (LPDDR5). The semiconductor device 10 may be integrated on a single semiconductor chip and has a memory cell array 11. The memory cell array 11 is provided with a plurality of word lines WL and a plurality of bit lines BL and has a configuration in which memory cells MC are disposed at the intersection points thereof. Selection of the word lines WL is carried out by a row decoder 12, and selection of bit lines BL is carried out by a column decoder 13. The memory cell array 11, the row decoder 12, the column decoder 13, and a read/write amplifier 14 are divided into eight banks BANK0 to BANK7.

Moreover, the semiconductor device 10 is provided with address terminals 21, command terminals 22, clock terminals 23, data terminals 24, data mask terminals 25, and power supply terminals 26 and 27 as external terminals.

The address terminals 21 are the terminals to which address signals ADD are input from outside. The address signals ADD are supplied to an address output circuit 32 via an address input circuit 31. The address output circuit 32 supplies a row address XADD to the row decoder 12 and supplies a column address YADD to the column decoder 13. Moreover, the row address XADD is supplied also to a refresh address control circuit 40.

The command terminals 22 are the terminals to which command signals COM are input from outside. The command signals COM are supplied to a command decoder 34 via a command input circuit 33. The command decoder 34 is a circuit which generates various internal commands by decoding the command signals COM. Examples of the internal commands include active signals ACT, pre-charge signals Pre, read/write signals R/W, and refresh signals AREF.

The active signal ACT is a pulse signal which is activated when the command signal COM is indicating row access (active command). When the active signal ACT is activated, the row decoder 12 of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 12 of the specified bank address and the word line WL specified by the row address XADD controlled thereby are deactivated.

The read/write signal R/W is a pulse signal which is activated when the command signal COM is indicating column access (read command or write command). When the read/write signal R/W is activated, the column decoder 13 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 24 to outside via a sense amplifier SAMP, a transfer gate TG, the read/write amplifier 14, and an input/output circuit 15.

On the other hand, if the active command and the write command are input, if the row address XADD and the column address YADD are input in synchronization with them, and, then, if write data DQ is input to the data terminal 24, the write data DQ is supplied to the memory cell array 11 via the input/output circuit 15, the read/write amplifier 14, the transfer gate TG, and the sense amplifier SAMP and is written to the memory cell MC specified by the row address XADD and the column address YADD. It will be appreciated that the write DQ and the read DQ may include multilevel signals, and the input/output circuit 15 may include circuitry to encode and decode multilevel signals. For example, the input/output circuit 15 may include a driver circuit to provide a first bitstream, such as the driver circuit 300, which may be combined with a second bitstream provided by a second driver circuit at an interconnect (not shown) to provide a multilevel signal. If the semiconductor device 10 is an LSB device, the driver circuit may provide the first bitstream using a weaker driver than the driver circuit from the second memory device providing the second bitstream. If the semiconductor device 10 is an MSB device, the driver circuit may provide the first bitstream using a stronger driver than the driver circuit from the second memory device providing the second bitstream. On the receive side, the input/output circuit 15 may include a receiver and decoder circuit that is configured to decode a multilevel signal based on whether the semiconductor device 10 is an LSB device or an MSB device. If the semiconductor device is an MSB device, the receiver and decoder circuit may compare the multilevel signal against a middle reference voltage signal to determine an MSB value of the multilevel signal. If the semiconductor device is an LSB device, the receiver and decoder circuit may compare the multilevel signal against three reference voltage signals (low, middle, and high) to determine an LSB value of the multilevel signal.

The refresh signal AREF is a pulse signal which is activated when the command signal COM is indicating an auto-refresh command. Also, when the command signal COM is indicating a self-refresh entry command, the refresh signal AREF is activated once immediately after command input, thereafter, is cyclically activated at desired internal timing, and a refresh state is continued. By a self-refresh exit command thereafter, the activation of the refresh signal AREF is stopped and returns to an IDLE state. The refresh signal AREF is supplied to the refresh address control circuit 40. The refresh address control circuit 40 supplies a refreshing row address RXADD to the row decoder 12, thereby activating the predetermined word line WL contained in the memory cell array 11, thereby refreshing the information of the corresponding memory cell MC. Other than the refresh signal AREF, the active signal ACT, the row address XADD, etc. are supplied to the refresh address control circuit 40. Details of the refresh address control circuit 40 will be described later.

External clock signals CK and /CK are input to the clock terminals 23. The external clock signals CK and the external clock signals /CK are mutually complementary signals, and both of them are supplied to the clock input circuit 35. The clock input circuit 35 generates internal clock signals ICLK based on the external clock signals CK and /CK. The internal clock signals ICLK are supplied to the command decoder 34, an internal clock generator 36, etc. The internal clock generator 36 generates internal clock signals LCLK, which control the operation timing of the input/output circuit 15.

The data mask terminals 25 are the terminals to which data mask signals DM are input. When the data mask signal DM is activated, overwrite of corresponding data is prohibited.

The power supply terminals 26 are the terminals to which power supply potentials VDD and VSS are supplied. The power supply potentials VDD and VSS supplied to the power supply terminals 26 are supplied to a voltage generator 37. The voltage generator 37 generates various internal potentials VPP, VOD, VARY, VPERI, etc. based on the power supply potentials VDD and VSS. The internal potential VPP is the potential mainly used in the row decoder 12, the internal potentials VOD and VARY are the potentials used in the sense amplifier SAMP in the memory cell array 11, and the internal potential VPERI is the potential used in many other circuit blocks.

The power supply terminals 27 are the terminals to which power supply potentials VDDQ and VSSQ are supplied. The power supply potentials VDDQ and VSSQ supplied to the power supply terminals 27 are supplied to the input/output circuit 15. The power supply potentials VDDQ and VSSQ are the same potentials as the power supply potentials VDD and VSS, respectively, which are supplied to the power supply terminals 26. However, the dedicated power supply potentials VDDQ and VSSQ are used for the input/output circuit 15 so that power supply noise generated by the input/output circuit 15 does not propagate to other circuit blocks.

Figure 6A:
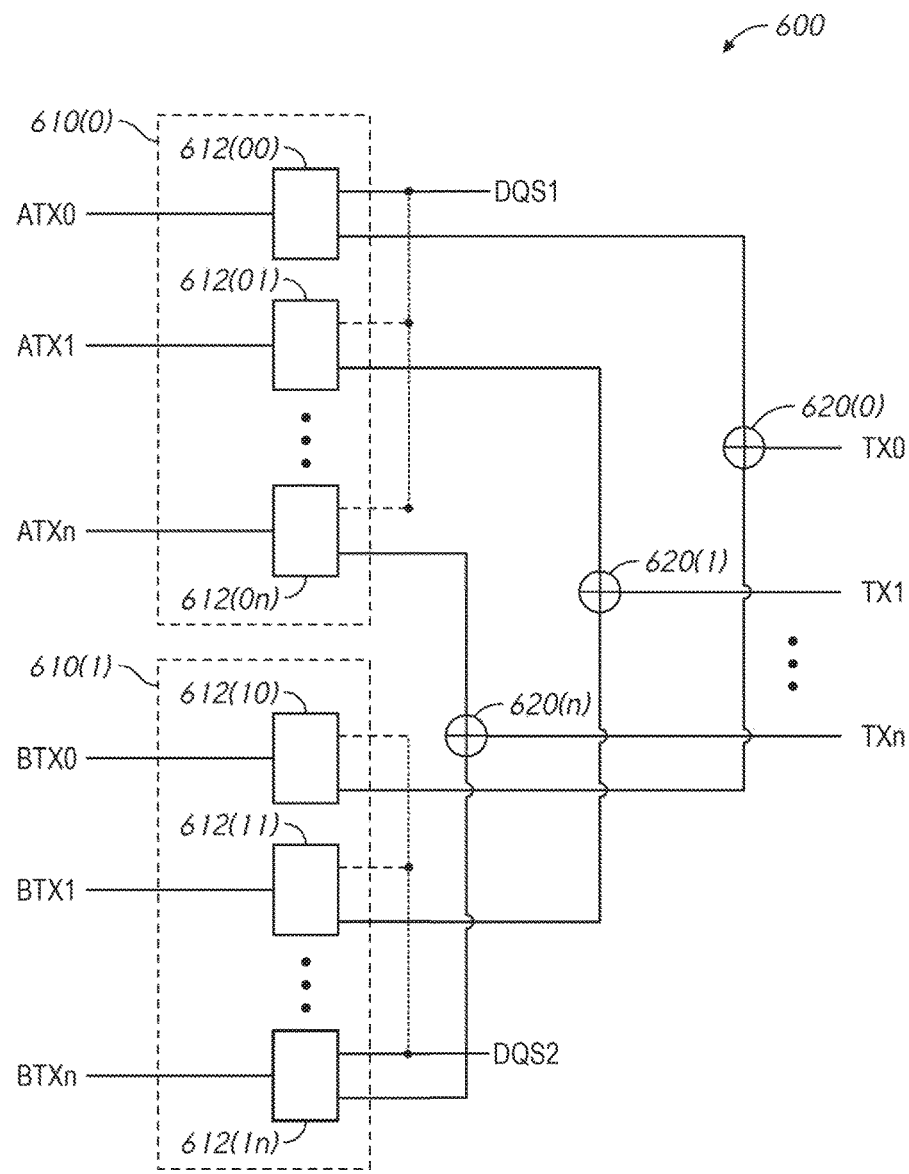
FIGS. 6A and 6B are a block diagram of a memory system for a multilevel communication architecture according to an embodiment of the present disclosure.
Figure 6B:
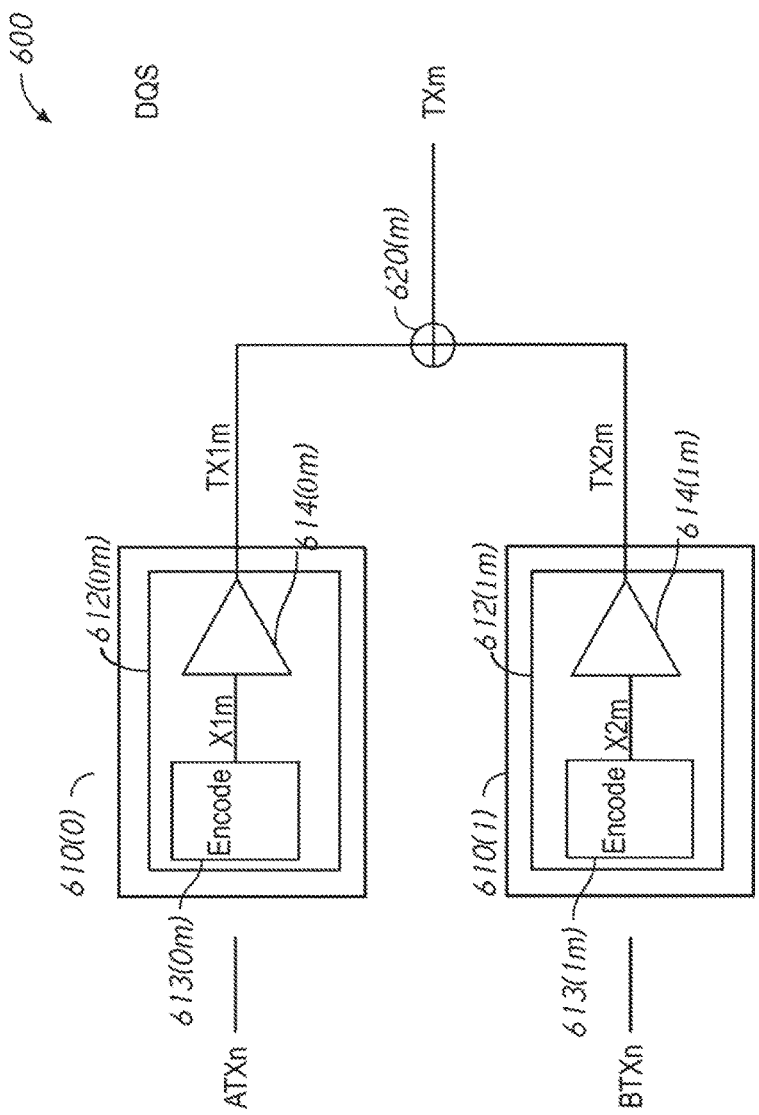

FIGS. 6A and 6B are block diagrams of a memory system 600 for a multilevel communication architecture according to an embodiment of the present disclosure. FIG. 6A shows a first memory device 610(0) that includes multiple the driver circuits 612(00)-(0n) each configured to encode respective bitstreams ATX1-n and provide the encoded respective bitstreams ATX1-n to a respective interconnect 620(0)-(n). FIG. 6A further shows a second memory device 610(1) that includes multiple the driver circuits 612(10)-(1n) each configured to encode respective bitstreams BTX1-n and provide the encoded respective bitstreams BTX1-n to a respective interconnect 620(0)-(n). The respective interconnects 620(0)-(n) are configured to combine the respective encoded ATX1-n and BTX1-n signals into a respective multilevel signal TX1-n to be provided on the respective signal lines. FIG. 6B is a detailed depiction of a single driver circuit 612(0m) within the first memory device 610(0) and a single driver circuit 612(1m) within the second memory device 610(1). The first memory device 610(0) of FIG. 6B corresponds to the first memory device 610(0) of FIG. 6A, and driver circuit 612(0m) of FIG. 6B corresponds to individual ones of the driver circuits 612(00)-(0n) of FIG. 6A. The second memory device 610(1) of FIG. 6B corresponds to the second memory device 610(1) of FIG. 6A, and driver circuit 612(1m) of FIG. 6B corresponds to individual ones of the driver circuits 612(10)-(1n) of FIG. 6A. The interconnect 620(m) of FIG. 6B corresponds to any one of the interconnects 620(0)-(n) of FIG. 6A. In FIG. 6B, the driver circuit 612(0m) may encode a first bitstream ATXn to provide a TX1m signal and the driver circuit 612(1m) may encode a second bitstream BTXn to provide a TX2m signal. Each of the encoded bitstreams may be provided to the interconnect 620(m), which may combine the TX1m and TX2m signals into a multilevel signal TXm on a signal line. The driver circuits 612 (00)-(0n) and 612 (10)-(1n) of FIG. 6A and/or the driver circuits 612(0m) and 612(1m) of FIG. 6B may be implemented in the memory devices 110(0)-(1) of FIG. 1, the semiconductor device 10 of FIG. 5, or combinations thereof. For clarity, the foregoing description will pertain to the driver circuit 612(0m) of the first memory device 610(0) and the driver circuit 612(1m) of the second memory device 610(1) of FIG. 6B, but it is understood that similar components and operation may be implemented in the individual driver circuits 612(00)-(0n) of the first memory device 610(0) and individual driver circuits 612 (10)-(1n) of the second memory device 610(1) of FIG. 6A.

The memory system 600 may transmit a first bitstream ATXm from a first memory device 610(0) and a second bitstream BTXm from a second memory device 610(1) using control signals X1m and X2m, respectively, the transmitted ATXm and BTXm bitstreams into a single multilevel signal TXm at interconnect 620.

The first memory device 610(0) may include an I/O circuit 612(0m) having an encoder 613(0m) and a driver 614(0m). The encoder 613(0m) may receive a first bitstream ATXm and may provide control signal X1m to the driver 612(0m). The driver 612(0m) may drive the TX1m signal responsive to the X1m signal. The second memory device 610(1) may include an I/O circuit 612(1m) having an encoder 613(1m) and a driver 614(1m). The encoder 613 (1m) may receive a second bitstream BTXm and may provide control signal X2m to the driver 612(1m). The driver 614(1m) may drive the TX2m signal responsive to the X2m signal. The drivers 612(0m)-(1m) may provide the TX1m and TX2m signals, respectively, to the interconnect 620(m). The interconnect may combine the TX1m and TX2m signals into a single multilevel signal TXm provided over a signal line of an I/O bus.

In operation, the encoder 613(1m) may receive a first bitstream ATXm and may provide control signal X1m to the driver 612(1m). The encoder 613(1m) may receive a second bitstream BTXm and may provide control signal X2m to the driver 612(1m). The drivers 614(0m) and 614(1m) may provide the TX1m and TX2m signals, respectively, to the interconnect 620(m) in response to the X1m and X2m signals, respectively. The drivers 614(0m) and 614(1m) may include different drive strengths such that when the TX1m and TX2m signals are combined at the interconnect 620(m), the TXm signal is a multilevel signal. In an embodiment, the driver 614(0m) may have a first drive strength to drive the TX1m signal that is greater than a second drive strength of the driver 614(1m) driving the TX2m signal. For example, if the drive strengths of the drivers 614(0m) and 614(1m) were equal when the driver 614(0m) drives a high voltage and the driver 614(1m) drives a low voltage, the combined voltage of the multilevel signal would be approximately halfway between the low voltage and the high voltage. However, because the drive strengths of the drivers 614(0m) and 614(1m) are different, the combined voltage of the multilevel signal will be between a middle voltage and the high voltage because the strength of the driver 614(0m) is higher than the strength of the driver 614(1m).

In an example, the drivers 614(0m) and 614(1m) may each implement the driver 300 of FIG. 3, with each of the driver 614(0m) using a different number of driver legs than the driver 614(1). The ratio of the allocated driver legs for each of the drivers 614(0m) and 614(1m) indicates a number of uniformly spaced levels. Thus, a 2:1 driver leg ratio between the drivers 614(0m) and 614(1m) will generate four uniformly spaced levels. For example, the driver 614(0m) may use four driver legs, similar to the first driver section 310 of FIG. 3; and the driver 614(1m) may use two driver legs, similar to the second driver section 320 of FIG. 3. In this example, the multilevel TX signal may include the TX1 data as MSB data and the TX2 signal as TX2 data based on the greater signal strength of the driver 614(0m) as compared with the driver 614(1m).

In some examples, timing between the first and second memory devices 610(0)-(1) may be important in driving signals over the I/O bus. Thus, one or both of the memory devices 610(0)-(1) may provide a respective strobe signal DQS1 or DQS2 to provide a clock signal used to capture data received at the host. In some examples, one or both of the memory devices 610(0)-(1) may also receive a respective strobe signal DQS1 or DQS2, and the respective I/O circuit 612(0m) and/or 612(1m) may include a timing circuit to synchronize transition timing between symbols for transmission over the TX1m and/or TX2m signal based on the DQS1 or DQS2 signal. In some examples, while transition timing of symbol periods may be synchronized, start and end times for data provided from the memory devices 610(0)-(1) may be offset based on timing of receipt of memory access requests. For example, a first read request may be provided to the memory device 610(0) at a time TO and a second request may be provided to the memory device 610(1) at a time TI. As a result, transmission of first read data from the memory device 610(0) may begin before transmission of second read data from the memory device 610(1). A receiver of the TX signal may decode data based on known timing of read requests provided to the memory devices 610(0)-(1).

In some examples, the memory devices 610(0)-(1) may include identical architecture, and may be configured to transmit MSB or LSB data on the multilevel signal lines based on a received signal (e.g., from a host such as the host 104 of FIG. 1), or based on a setting stored at the respective memory devices 610(0)-(1).

Figure 7A:
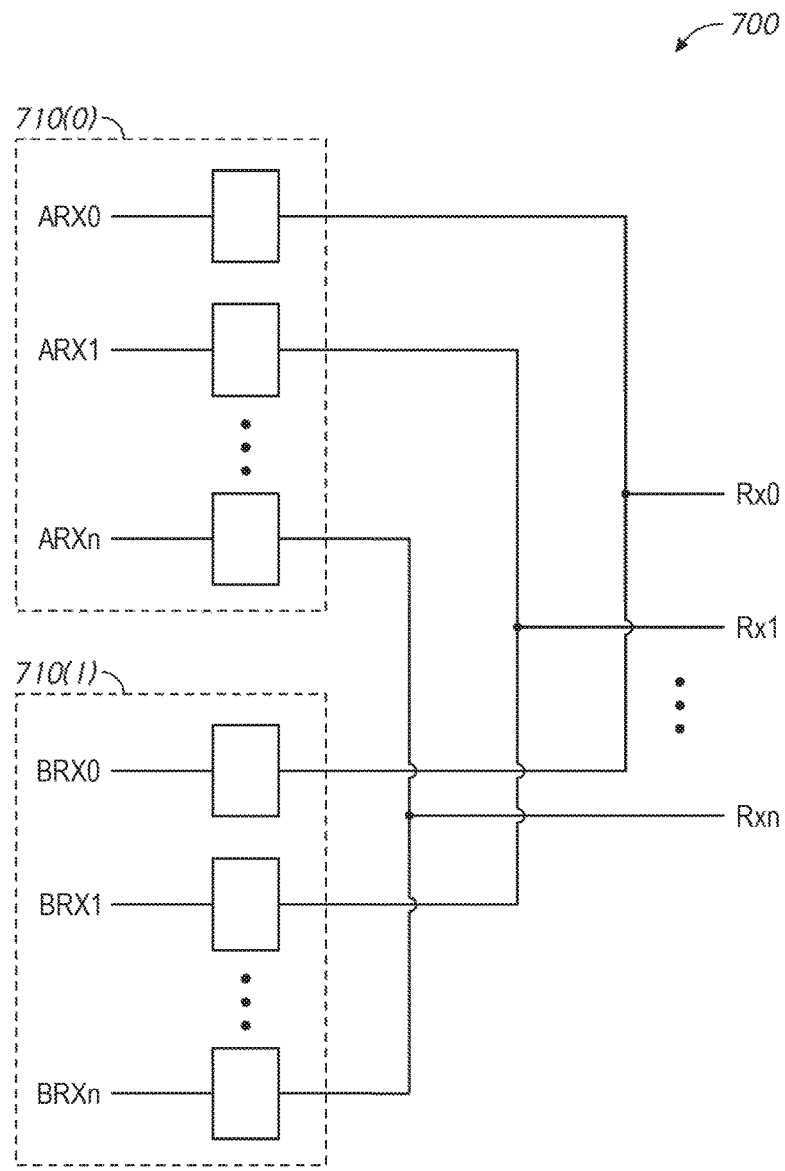
FIGS. 7A and 7B are a block diagram of a memory system for a multilevel communication architecture according to an embodiment of the present disclosure.
Figure 7B:
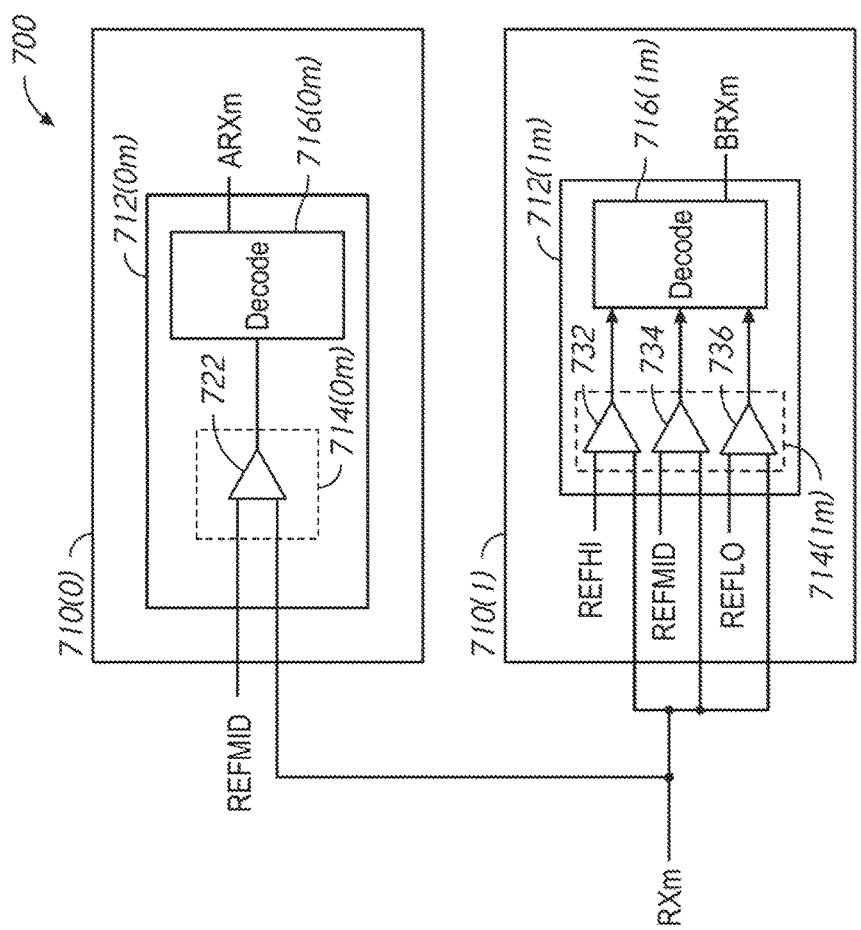

FIGS. 7A and 7B are block diagrams of a memory system 700 for a multilevel communication architecture according to an embodiment of the present disclosure. FIG. 7A shows a first memory device 710(0) that includes multiple the receiver and decoder circuits 712(00)-(0n) each configured to receive respective multilevel signals RX0-RXn on corresponding signal lines and to decode the respective multilevel signals RX0-RXn to retrieve respective bitstreams ARX1-n. FIG. 7A further shows a second memory device 710(1) that includes multiple the receiver and decoder circuits 712(10)-(1n) each configured to each configured to receive respective multilevel signals RX0-RXn on respective signal lines and to decode the respective multilevel signals RX0-RXn to retrieve respective bitstreams BRX1-n. FIG. 7B is a detailed depiction of a single receiver and decoder circuit 712(0m) within the first memory device 710(0) and a single receiver and decoder circuit 712(1m) within the second memory device 710(1). The first memory device 710(0) of FIG. 7B corresponds to the first memory device 710(0) of FIG. 7A, and receiver and decoder circuit 712(0m) of FIG. 7B corresponds to individual ones of the receiver and decoder circuits 712(00)-(On) of FIG. 7A. The second memory device 710(1) of FIG. 7B corresponds to the second memory device 710(1) of FIG. 7A, and receiver and decoder circuit 712(1m) of FIG. 7B corresponds to individual ones of the receiver and decoder circuits 612(10)-(1n) of FIG. 7A. In FIG. 7B, the receiver and decoder circuit 712(0m) and the receiver and decoder circuit 712(1m) may each receive a multilevel signal RXm on a respective signal line and may decode the respective multilevel signal to retrieve respective bitstreams ARXm and BRXm. The receiver and decoder circuits 712 (00)-(0n) and 712 (10)-(1n) of FIG. 7A and/or the receiver and decoder circuits 712(0m) and 712(1m) of FIG. 7B may be implemented in the memory devices 110(0)-(1) of FIG. 1, the semiconductor device 10 of FIG. 5, or combinations thereof. For clarity, the foregoing description will pertain to the receiver and decoder circuit 712(0m) of the first memory device 710(0) and the receiver and decoder circuit 712(1m) of the second memory device 710(1) of FIG. 7B, but it is understood that similar components and operation may be implemented in the individual receiver and decoder circuits 712(00)-(On) of the first memory device 710(0) and individual driver circuits 712 (10)-(1n) of the second memory device 710(1) of FIG. 7A.

The memory system 700 may receive a multilevel signal RXm at memory devices 710(0)-(1). The memory device 710(0) may decode the RXm signal to retrieve a first bitstream ARXm and the memory device 710(1) may decode the RXm signal to retrieve a second bitstream BRXm. The memory devices 710(0)-(1) may implement the memory devices 110(0)-(1) of FIG. 1, the semiconductor device 10 of FIG. 5, memory devices 610(0)-(1) of FIGS. 6A and 6B, or combinations thereof.

Each of the memory devices 710(0)-(1) may include a respective I/O circuit 712(0m) and 712(1m). Each respective I/O circuit 712(0m) and 712(1m) may include a respective comparator circuit 714(0m) and 714(1m) coupled to a respective decoder 716(0m) and 716(1m). The comparison circuit 714(0m) may include comparator 722. The comparator 722 may be configured to compare the RXm signal to a middle reference signal REFMID to provide a compare signal to the decoder 716(0m). The decoder 716(0m) may include logic to generate the ARXm bitstream. The ARXm bitstream signal may be logical equivalent of an ATXm bitstream transmitted from a host device, such as the host 104 of FIG. 1.

The comparison circuit 714(1m) may include comparators 732, 734, and 736 coupled to the decoder 716(1m). The comparator 732 may compare the RXm signal to a high reference signal REFHI to provide a first signal to the decoder 716(1m). The comparator 734 may compare the RXm signal to the REFMID signal to provide a second signal to the decoder 716(1). The comparator 736 may compare the RXm signal to a low reference signal REFLO to provide a third signal to the decoder 716(1m). The decoder 716(1m) may include logic to generate the BRXm bitstream based on the signals from the comparators 732, 734, and 736. The BRXm bitstream signal may be logical equivalent of a BTXm bitstream transmitted from a host device, such as the host 104 of FIG. 1.

In operation, the RXm signal may be a multilevel signal with MSB data directed to the memory device 710(0) and LSB data directed to the memory device 710(1). In memory device 710(0), the comparator 722 may receive the voltage from the RXm signal via a signal line of the I/O bus, and may provide the comparison signal based on the comparison between the voltage of the RXm signal and the REFMID voltage. The decoder 716(0m) may include decoding logic to generate the ARXm bitstream based on the comparison signal. For example, the ARXm bitstream may have a high value while the comparison signal has a high value and may have a low value while the comparison signal has a low value. Other polarity relationships between the comparison signal and the ARXm bitstream may be defined without departing from the scope of the disclosure.

In memory device 710(1), comparators 732, 734, and 736 may receive the voltage from the RXm signal via a signal line of the I/O bus. The comparator 732 may provide the first signal based on the comparison between the voltage of the RXm signal and the REFHI voltage. The comparator 734 may provide the second signal based on the comparison between the voltage of the RXm signal and the REFMID voltage. The comparator 736 may provide the third signal based on the comparison between the voltage of the RXm signal and the REFLO voltage. The decoder 716(1) may include decoding logic to generate the BRX bitstream based on the first, second, and third signals from the comparators 732, 734, and 736, respectively. For example, when the level of the first signal is high, the BRXm signal is high; when the level of the first signal is low and the level of the second signal is high, the BRXm bitstream is low; when the level of the second signal is low and the level of the third signal is high, the BRXm signal is high; and when the level of the third signal is low, the BRXm bitstream is low. The ARXm and BRXm bitstreams may be provided to respective downstream circuitry of the memory devices 710(0)-(1) for processing, such as being processed as data to be stored at a memory or as data that has been retrieved from a memory, or as commands or addresses to be decoded and used to perform memory access operations. While FIG. 7 depicts a memory system 700 with two memory devices 710(0)-(1), more memory devices may be included without departing from the scope of the disclosure.

For example, it is assumed that the RXm signal is a multilevel bitstream signal as indicated in FIG. 7B, which is corresponding to the TXm signal of FIG. 2B. The memory devices 710(0) and 710(1) receive the RXm signal. The decoder 716 (0m) produces the ARXm bitstream having a bitstream "0", "0", "1" and "1" and the decoder 716 (1m) produces the BRXm bitstream having a bit stream "0", "1", "0" and "1". Therefore, the respective memory devices 710(0) and 710(1) can correctly receive the ATXm and BTXm bitstreams in the host 104 via I/O bus such that the ATXm and BTXm bitstreams can be stored into the memory cell array 11 in the memory devices 710(0) and 710(1), respectively.

In some examples, the memory devices 710(0)-(1) may include identical architecture, and may be configured to receive MSB or LSB data on the multilevel signal lines based on a received signal (e.g., from a host such as the host 104 of FIG. 1), or based on a setting stored at the respective memory devices 710(0)-(1). For example, the memory devices 710(0)-(1) couple be implemented identically and subsequently programmed to serve as a MSB or a LSB device. In one example, chip select signals may be sent in parallel with the data over an I/O bus, and the memory devices 710(0)-(1) may determine whether to retrieve the MSB data or the LSB data based on a value of the corresponding chip select signal.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
an input/output (I/O) circuit comprising a driver circuit configured to convert a first signal directed to a first device and a second signal directed to a second device into a multilevel signal that includes more than two values, the driver circuit further configured to drive the multilevel signal onto a signal line coupled to the first device and to the second device.

2. The apparatus of claim 1, wherein the driver circuit comprises a multi-leg driver that is divided into at least two sections for driving the more than two voltages.

3. The apparatus of claim 2, wherein the driver circuit includes an encoder configured to provide a first control signal and a second control signal, wherein the driver circuit is configured to provide the multilevel signal in response to the first control signal and the second control signal.

4. The apparatus of claim 3, wherein the first control signal is configured to control a first driver leg of the driver circuit and the second control signal is configured to control a second driver leg of the driver circuit.

5. The apparatus of claim 4, wherein the first driver leg and second driver leg may each comprise more than one leg in parallel.

6. The apparatus of claim 4, wherein the first driver leg provides a greater drive strength than the second driver leg, wherein drive strength is determined by voltage or current drive impedance.

7. The apparatus of claim 1 further comprising a receiver and decoder circuit configured to receive a second multilevel signal via a second signal line coupled to the first device and to the second device, wherein the receiver and decoder circuit is further configured to decode the second multilevel signal to provide a third signal from the first device and a fourth signal from the second device.

8. The apparatus of claim 7, wherein the receiver and decoder circuit comprises a plurality of comparators, wherein a comparator of the plurality of comparators is configured to compare a signal level of the second multilevel signal with a reference level and to provide a comparison signal based on the comparison, wherein the decoded second multilevel signal to provide the third signal and the fourth signal is based at least in part on the comparison signal.

9. The apparatus of claim 8, wherein the receiver and decoder circuit is further configured to decode the multilevel signal to provide the first signal and the second signal based on known latencies between respective requests to provide information included in the first signal and in the second signal.

10. An apparatus, comprising:
an interconnect configured to receive a first transmit signal from a first memory device and a second transmit signal from a second memory device and to combine the first transmit signal and the second transmit signal into a multilevel signal that includes more than two values and to provide the multilevel signal to a host over a signal line.

11. The apparatus of claim 10, wherein the multilevel signal is a command signal or an address signal.

12. The apparatus of claim 10, wherein the first memory device includes a first drive strength and the second memory device includes a second drive strength such that the multilevel signal is decodable.

13. The apparatus of claim 12, wherein:
the first memory device includes a first driver circuit and is configured to drive a first subset of driver legs of the first driver circuit; and
the second memory includes a second driver circuit and is configured to drive a second subset of driver legs of the second driver circuit.

14. The apparatus of claim 13, wherein a number of driver legs in the first subset of driver legs of the first driver circuit is greater than a number of driver legs in the second subset of driver legs of the second driver circuit.

15. The apparatus of claim 13, wherein the first driver circuit is further configured to provide a strobe signal to provide transition timing for the multilevel signal.

16. The apparatus of claim 15, wherein the second memory is configured to receive the strobe signal from the first memory device and wherein a second I/O circuit of the second memory is configured to control timing of symbol transitions for the second transmit signal in response to the strobe signal.

17. The apparatus of claim 10, wherein:
the first memory comprises a first receiver and decoder circuit configured to receive a second multilevel signal via a second signal line and to decode the second multilevel signal to provide a third transmit signal; and
the second memory device comprises a second receiver and decoder circuit configured to receive the second multilevel signal via the second signal line and to decode the second multilevel signal to provide a fourth transmit signal.

18. The apparatus of claim 17, wherein the first receiver and decoder circuit uses a single comparator to decode the second multilevel signal to provide the third transmit signal, and wherein the second receiver and decoder circuit uses a plurality of comparators to decode the second multilevel signal to provide the fourth transmit signal.

19. A method comprising:
receiving a multilevel signal provided from a host at a first device and at a second device via a signal line;
decoding the multilevel signal at the first device to retrieve a first signal; and
decoding the multilevel signal at the second device to retrieve a second signal.

20. The method of claim 19, wherein decoding the multilevel signal to retrieve the first signal at the first device comprises retrieving a most significant bit portion of the multilevel signal to retrieve the first signal.

21. The method of claim 20, wherein decoding the multilevel signal to retrieve the second signal at the second device comprises retrieving a least significant bit portion of the multilevel signal to retrieve the second signal.

22. The method of claim 20 further comprising determining, at the first device, to decode the most significant bit portion of the multilevel signal based on a configuration setting stored at the first device.

23. The method of claim 20 further comprising:
receiving a chip select signal at the first device from the host; and
determining, at the first device, to decode the most significant bit portion of the multilevel signal based on a value of the chip select signal.

* * * * *